United States Patent
Han et al.

(10) Patent No.: US 12,245,482 B2
(45) Date of Patent: Mar. 4, 2025

(54) DISPLAY DEVICE

(71) Applicant: LG Display Co., Ltd., Seoul (KR)

(72) Inventors: SunWoong Han, Seoul (KR); Sang-Il Shin, Paju-si (KR); Jaechang Kang, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/405,889

(22) Filed: Jan. 5, 2024

(65) Prior Publication Data

US 2024/0147791 A1    May 2, 2024

Related U.S. Application Data (63) Continuation of application No. 17/458,062, filed on Aug. 26, 2021, now Pat. No. 11,903,277.

(30) Foreign Application Priority Data

Sep. 1, 2020    (KR) .................... 10-2020-0110817

(51) Int. Cl.
*H10K 59/131*    (2023.01)
*H10D 89/60*    (2025.01)
*H10K 59/121*    (2023.01)

(52) U.S. Cl.
CPC ......... *H10K 59/131* (2023.02); *H10D 89/601* (2025.01); *H10K 59/121* (2023.02)

(58) Field of Classification Search
CPC .................... H10K 59/131; H10K 59/121
See application file for complete search history.

(56) References Cited

U.S. PATENT DOCUMENTS

| | | | |
|---|---|---|---|
| 6,232,142 B1 * | 5/2001 | Yasukawa | H01L 21/76254 |
| | | | 438/69 |
| 10,580,847 B2 | 3/2020 | Um et al. | |
| 10,679,561 B2 | 6/2020 | Kim et al. | |
| 11,348,527 B2 | 5/2022 | Kim et al. | |
| 11,568,818 B2 | 1/2023 | Kim et al. | |
| 11,893,941 B2 | 2/2024 | Kim et al. | |

(Continued)

FOREIGN PATENT DOCUMENTS

| KR | 10-2019-0012470 A | 2/2019 |
|---|---|---|
| KR | 10-2019-0022980 A | 3/2019 |
| KR | 10-2019-0055574 A | 5/2019 |

OTHER PUBLICATIONS

Korean Intellectual Property Office, Office Action, Korean Patent Application No. 10-2020-0110817, Jun. 20, 2024, nine pages.

(Continued)

*Primary Examiner* — Douglas M Menz
(74) *Attorney, Agent, or Firm* — Fenwick & West LLP (57) ABSTRACT

According to an exemplary embodiment of the present disclosure, a display device includes a display panel divided into a display area, a non-display area, a bending area, and a pad area and bent in one direction in the bending area; a plurality of pixels disposed in the display area; at least one gate driver disposed in the non-display area and configured to supply a gate voltage to the plurality of pixels; flexible films connected to a plurality of pads disposed in the pad area; and at least one electrostatic discharge (ESD) circuit disposed in the pad area and connected to the at least one gate driver through a discharge line.

19 Claims, 7 Drawing Sheets

(56) References Cited

U.S. PATENT DOCUMENTS

| | | |
|---|---|---|
| 2003/0049994 A1* | 3/2003 | Liang .................. B24B 37/042 |
| | | 451/41 |
| 2010/0225626 A1 | 9/2010 | Lin et al. |
| 2010/0238094 A1 | 9/2010 | Cho et al. |
| 2018/0068919 A1 | 3/2018 | Chung et al. |
| 2018/0166435 A1 | 6/2018 | Lee et al. |
| 2018/0212190 A1 | 7/2018 | Son et al. |
| 2019/0035872 A1 | 1/2019 | Um et al. |
| 2019/0066595 A1 | 2/2019 | Kim et al. |
| 2020/0302872 A1 | 9/2020 | Kim et al. |
| 2020/0381505 A1 | 12/2020 | Cho et al. |
| 2022/0284859 A1 | 9/2022 | Kim et al. |
| 2023/0169924 A1 | 6/2023 | Kim et al. |
| 2024/0119904 A1 | 4/2024 | Kim et al. |

OTHER PUBLICATIONS

China National Intellectual Property Administration, Office Action, Chinese Patent Application No. 20110975037.6, Dec. 23, 2024, 13 pages.

\* cited by examiner

DISPLAY DEVICE

CROSS-REFERENCE TO RELATED APPLICATIONS

This application is a continuation application of U.S. patent application Ser. No. 17/458,062 filed on Aug. 26, 2021, which claims the benefit of and priority to Korean Patent Application No. 10-2020-0110817 filed on Sep. 1, 2020 in the Republic of Korea, the entire contents of which are hereby expressly incorporated by reference into the present application.

BACKGROUND

Technical Field

The present disclosure relates to a display device, and more particularly, to a display device including an electrostatic discharge (ESD) circuit.

Discussion of the Related Art

Display devices used in computer monitors, TVs, and mobile phones include organic light emitting displays (OLEDs) and the like that emit light by themselves, and liquid crystal displays (LCDs) and the like that require a separate light source.

Such various display devices include a display panel including a plurality of sub-pixels and a driving unit for driving the display panel. The driving unit includes a gate driver that supplies a gate signal to the display panel and a data driver that supplies a data voltage. When a signal such as a gate signal and a data voltage is supplied to the sub-pixel, the selected sub-pixel emits light to thereby display an image.

Further, for a reduction in bezel, the driving unit may be disposed on a rear surface of the display panel, and lines configured to connect the driving unit and the sub-pixels may be bent from a front to a rear of the display panel.

As described above, as the lines are bent from the front to the rear of the display panel, cracks in peripheral components or separation between the peripheral components are caused.

Accordingly, there is a problem in that ESD circuits adjacent to the bending area are electrically corroded or are oxidized because moisture permeation occurs due to cracks or separation of the components.

SUMMARY

An object of the present disclosure is to provide a display device including an electrostatic discharge circuit in a pad area.

Another object of the present disclosure is to provide a display device in which oxygen and moisture cannot penetrate into an electrostatic discharge circuit.

Objects of the present disclosure are not limited to the above-mentioned objects, and other objects, which are not mentioned above, can be clearly understood by those skilled in the art from the following descriptions.

In order to solve the above problems, According to an exemplary embodiment of the present disclosure, a display device may include a display panel divided into a display area, a non-display area, a bending area, and a pad area and bent in one direction in the bending area; a plurality of pixels disposed in the display area; at least one gate driver disposed in the non-display area and configured to supply a gate voltage to the plurality of pixels; flexible films connected to a plurality of pads disposed in the pad area; and at least one electrostatic discharge (ESD) circuit disposed in the pad area and connected to the at least one gate driver through a discharge line.

Other detailed matters of the exemplary embodiments are included in the detailed description and the drawings.

According to the present disclosure, a gate driver and a plurality of pixels connected thereto can be protected by discharging static electricity through an electrostatic discharge circuit.

According to the present disclosure, due to a first trench and a second trench, even when a display panel is bent, a planarization layer configured to cover an electrostatic discharge circuit does not come off, so that external moisture or oxygen cannot penetrate into the electrostatic discharge circuit.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

The advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person with ordinary skill in the art to which the present disclosure pertains with the category of the present disclosure, and the present disclosure will be defined by the appended claims.

The shapes, dimensions, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the dimensions and thickness of each component illustrated in the drawings are represented for convenience in explanation, the present disclosure is not necessarily limited to the illustrated dimensions and thickness of each component.

The features of various embodiments of the present disclosure can be partially or entirely coupled to or combined with each other and can be interlocked and operated in technically various ways, and the embodiments can be carried out independently of or in association with each other.

A transistor used in a display device of the present disclosure may be implemented as at least one transistor of an n-channel transistor (NMOS) and a p-channel transistor (PMOS). The transistor may be implemented as an oxide semiconductor transistor having an oxide semiconductor as an active layer or a low temperature poly-silicon (LTPS) transistor having LTPS as an active layer. The transistor may include at least a gate electrode, a source electrode, and a drain electrode. The transistor may be implemented as a thin film transistor (TFT) on a display panel. In the transistor, carriers flow from the source electrode to the drain electrode. In the case of the re-channel transistor (NMOS), since carriers are electrons, a source voltage has a voltage level lower than that of a drain voltage so that the electrons can flow from the source electrode to the drain electrode. In the n-channel transistor (NMOS), a current may flow from the drain electrode to the source electrode, and the source electrode may be an output terminal. In the case of the p-channel transistor (PMOS), since carriers are holes, the source voltage is higher than the drain voltage so that the holes can flow from the source electrode to the drain electrode. In the p-channel transistor (PMOS), since holes flow from the source electrode to the drain electrode, a current flows from a source to a drain of the transistor, and the drain electrode may be an output terminal. Therefore, it should be noted that the source and drain of the transistor are not fixed since the source and drain can be changed according to an applied voltage. In the present disclosure, it is assumed that the transistor is the n-channel transistor (NMOS), but is not limited thereto. And, the p-channel transistor (PMOS) can be used, and thus, a circuit configuration may be changed.

Hereinafter, various exemplary embodiments of the present disclosure will be described in detail with reference to the accompanying drawings.

Figure 1:
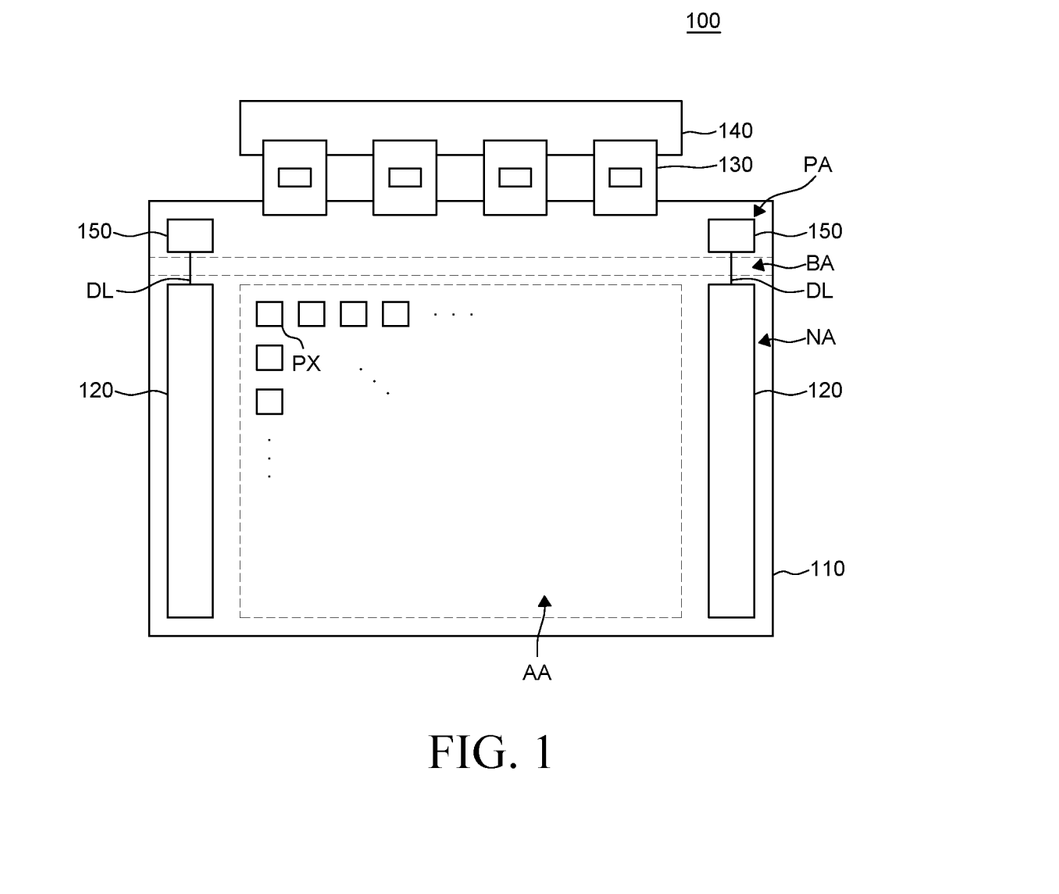
FIG. 1 is a schematic diagram of a display device according to an exemplary embodiment of the present disclosure.

FIG. 1 is a schematic diagram of a display device according to an exemplary embodiment of the present disclosure. Referring to FIG. 1, a display device 100 includes a display panel 110, a gate driver 120, flexible films 130, and a printed circuit board 140.

The display panel 110 is a panel for displaying an image. The display panel 110 may include various circuits, lines, and light emitting elements disposed on a substrate. Specifically, the display panel 110 may be divided into a display area AA, a non-display area NA, a bending area BA, and a pad area PA.

The display area AA of the display panel 110 is an area where an image is displayed. A plurality of pixels PX that are divided by a plurality of data lines and a plurality of gate lines intersecting each other in the display area AA of the display panel 110 and are connected to the plurality of data lines and the plurality of gate lines may be disposed. In addition, the plurality of pixels PX may include display elements that emit light and a pixel circuit that drives the display elements. For example, when the display panel 110 is an organic light emitting display panel, the display element may be an organic light emitting element including an anode, an organic light emitting layer, and a cathode. Alternatively, when the display panel 110 is an inorganic light emitting display panel, the display element may be a light emitting diode (LED) or a micro-LED including an n-type semiconductor layer, a p-type semiconductor layer, and a light emitting layer. However, the present disclosure is not limited thereto, and the display element may be configured in various manners.

In addition, the non-display area NA of the display panel 110 is an area that surrounds the display area AA and displays no image. At least one gate driver for driving the plurality of pixels may be disposed in the non-display area NA of the display panel 110. In addition, in the non-display area NA of the display panel 110, a plurality of gate lines configured to connect at least one gate driver and the plurality of pixels PX, and a high potential driving voltage line and a low potential driving voltage line for applying a driving voltage to the plurality of pixels PX may be disposed. However, components disposed in the non-display area NA of the display panel 110 are not limited thereto, and various circuits and lines may be additionally disposed.

In addition, the pad area PA of the display panel 110 is an area where a plurality of pads are disposed. Pads that are connected to the plurality of data lines may be disposed in the pad area PA of the display panel 110. Accordingly, the flexible film may be attached to the pad area PA of the display panel 110. Also, an electrostatic discharge (ESD) circuit may be disposed in the pad area PA of the display panel 110.

In addition, the bending area BA of the display panel 110 refers to an area where the display panel 110 is bent in one direction. In addition, the display area AA and the non-display area NA may be disposed at one side of the bending area BA, and the pad area PA may be disposed at the other side of the bending area BA. Accordingly, as the display panel 110 is bent in the bending area BA, the pad area PA may be disposed below the display area AA and the non-display area NA.

The gate driver 120 supplies gate signals to the plurality of pixels PX. The gate driver 120 includes a plurality of stages, and the respective stages may be electrically connected to each other. Accordingly, a gate voltage output from one stage may be transferred to another stage. In addition, the respective stages may sequentially supply gate voltages to the plurality of pixels PX connected to the respective stages through the gate lines. Also, as shown in FIG. 1, it may be formed in the non-display area NA of the display panel 110 in a gate in panel (GIP) manner.

A plurality of the flexible films 130 are bonded to the pad area PA of the display panel 110. The flexible film 130 is a film in which various components are disposed on a flexible base film to supply signals to the display element and a circuit unit, and may be electrically connected to the display panel 110. The plurality of flexible films 130 may supply a power voltage, a data voltage, and the like to the display panel 110. Meanwhile, in FIG. 1, it is illustrated that the plurality of the flexible films 130 are four flexible films 130 and bonded to a long side of the display panel 110, but the number and arrangement of the plurality of flexible films 130 may be variously changed depending on design and are not limited thereto.

Driving integrated circuits such as data drivers may be disposed on the plurality of flexible films 130. The driving integrated circuits are components that process data for displaying an image and driving signals for processing the data. The driving integrated circuits may be disposed in a method such as a chip-on-glass (COG), chip-on-film (COF), or tape carrier package (TCP) method according to a mounting method. For convenience of description, although it has been described that the driving integrated circuits are in a chip-on-film (COF) method in which they are mounted on the plurality of flexible films 130, the present disclosure is not limited thereto.

The printed circuit board 140 is electrically connected to the plurality of flexible films 130. The printed circuit board 140 is a component that supplies signals to the driving integrated circuit of the flexible films 130. Various components for supplying various signals such as a driving signal and a data signal to the driving integrated circuits may be disposed on the printed circuit board 140. For example, a plurality of printed lines for transmitting various signals such as a driving signal and a data signal may be formed on the printed circuit board 140. In addition, a printed circuit for controlling and compensating for various signals such as a driving signal and a data signal may also be formed on the printed circuit board 140.

Meanwhile, although one printed circuit board 140 is illustrated in FIG. 1, the number of printed circuit boards 140 may be variously changed according to design, but is not limited thereto.

Electrostatic discharge (ESD) circuits 150 discharge static electricity applied to the display panel 110. Specifically, the electrostatic discharge circuits 150 may be disposed in the pad area PA and may be connected to at least one gate driver 120 through discharge lines DL. Also, since the at least one gate driver 120 is disposed in the non-display area NA, the discharge lines DL may be disposed in the bending area BA. However, embodiments of the present disclosure are not limited thereto. For example, the electrostatic discharge circuits 150 may be connected to other components (e.g., gate lines, data lines or the plurality of pixels PX) of the display device 100 through the discharge lines DL.

The electrostatic discharge circuit 150 includes a plurality of transistors, and when external static electricity is applied to one electrode of the plurality of transistors, discharges static electricity through lines connected to the other electrodes of the plurality of transistors. Accordingly, since external static electricity may not be applied to the at least one gate driver, the electrostatic discharge circuit 150 may protect the gate driver. In addition, since external static electricity may not be applied to the plurality of pixels PX connected to the gate driver 120, the static discharge circuit 150 may also protect the plurality of pixels PX.

Hereinafter, FIGS. 2 to 6 will be referred together for a more detailed description of the electrostatic discharge circuit.

Figure 2:
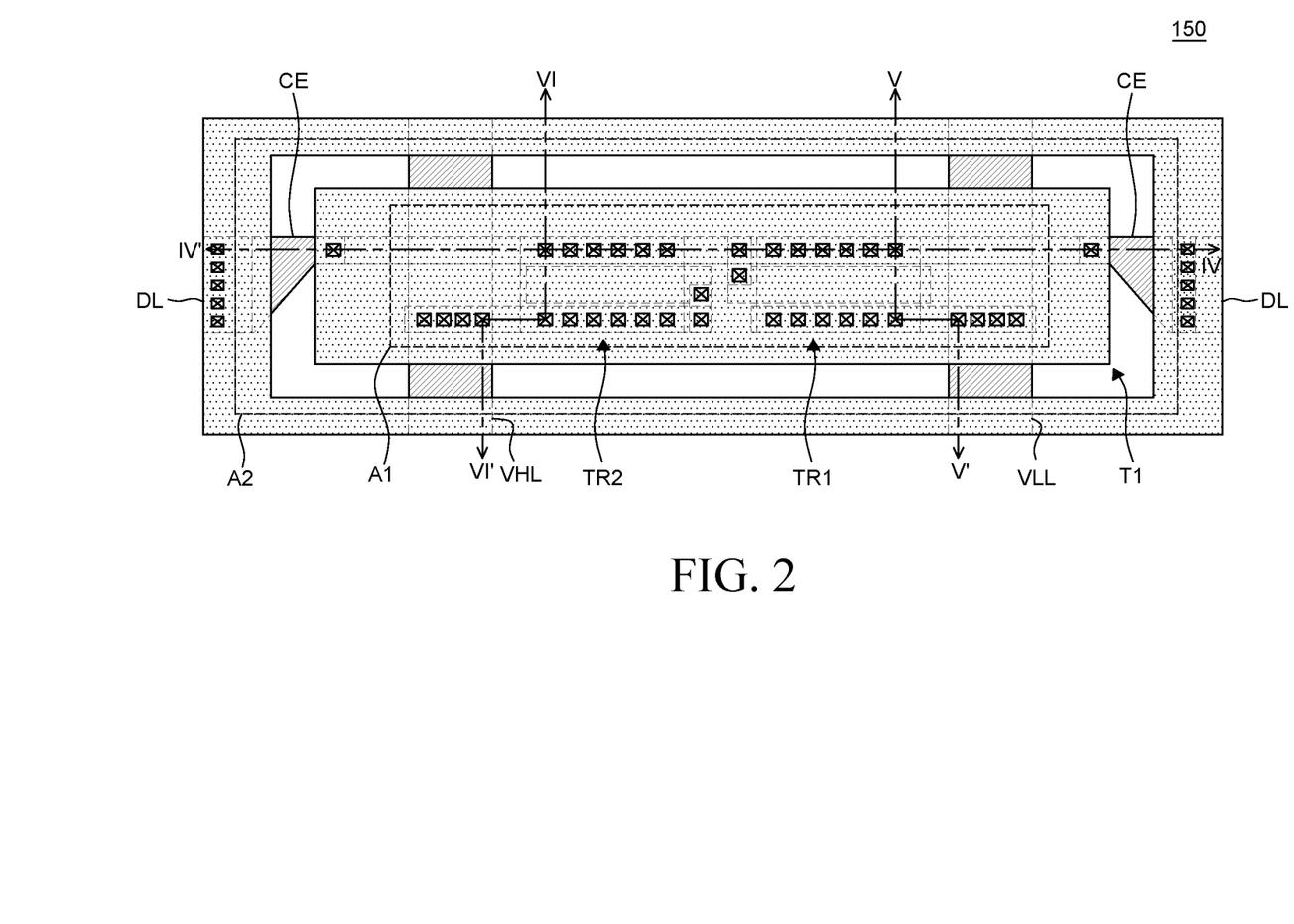
FIG. 2 is a plan view of an electrostatic discharge circuit of the display device according to an exemplary embodiment of the present disclosure.

FIG. 2 is a plan view of an electrostatic discharge circuit of the display device according to an exemplary embodiment of the present disclosure.

Figure 3:
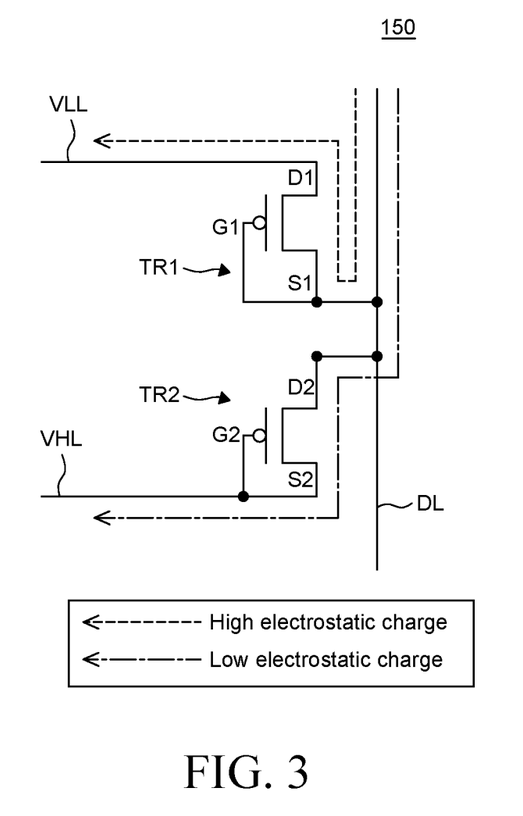
FIG. 3 is a circuit diagram of the electrostatic discharge circuit of the display device according to an exemplary embodiment of the present disclosure.

FIG. 3 is a circuit diagram of the electrostatic discharge circuit of the display device according to an exemplary embodiment of the present disclosure.

Figure 4:
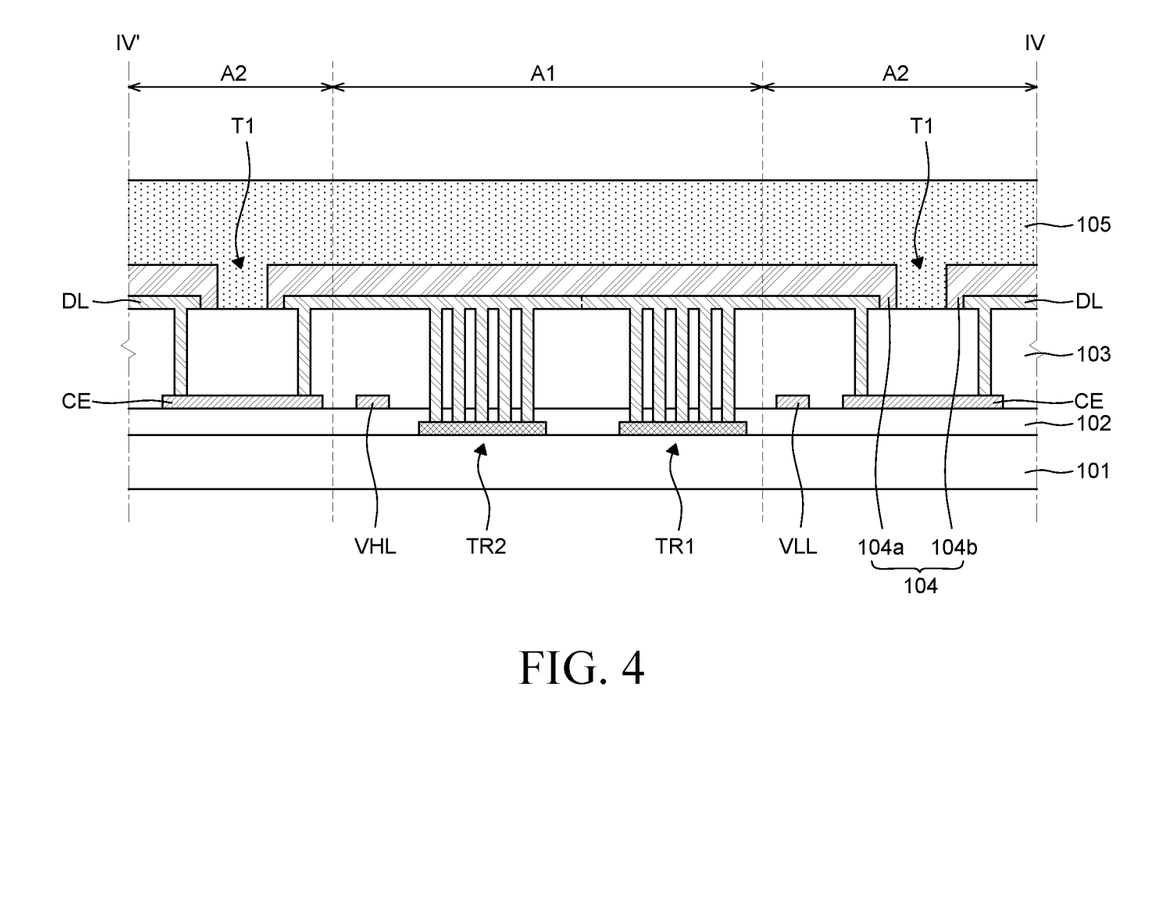
FIG. 4 is a cut-away view taken along line IV-IV' shown in FIG. 2.

FIG. 4 is a cut-away view taken along line IV-IV' shown in FIG. 2.

Figure 5:
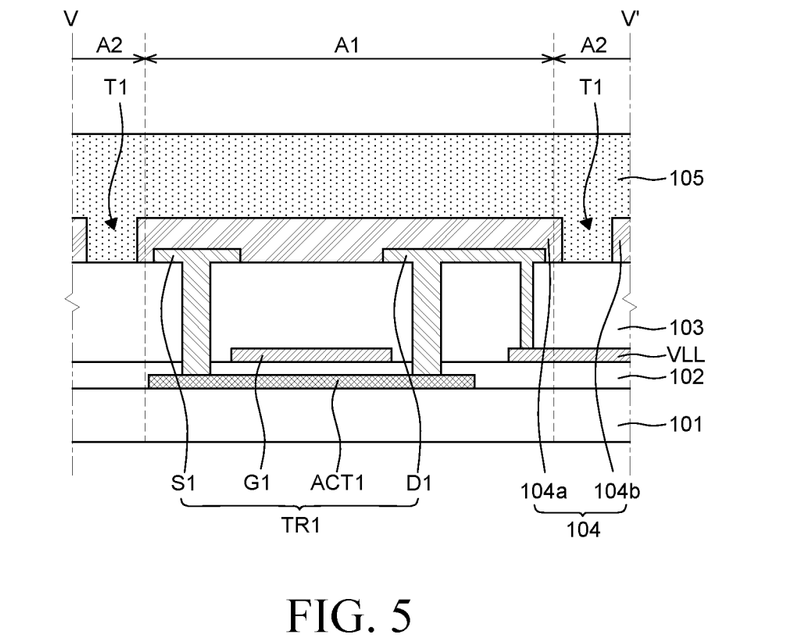
FIG. 5 is a cut-away view taken along line V-V' shown in FIG. 2.

FIG. 5 is a cut-away view taken along line V-V' shown in FIG. 2.

Figure 6:
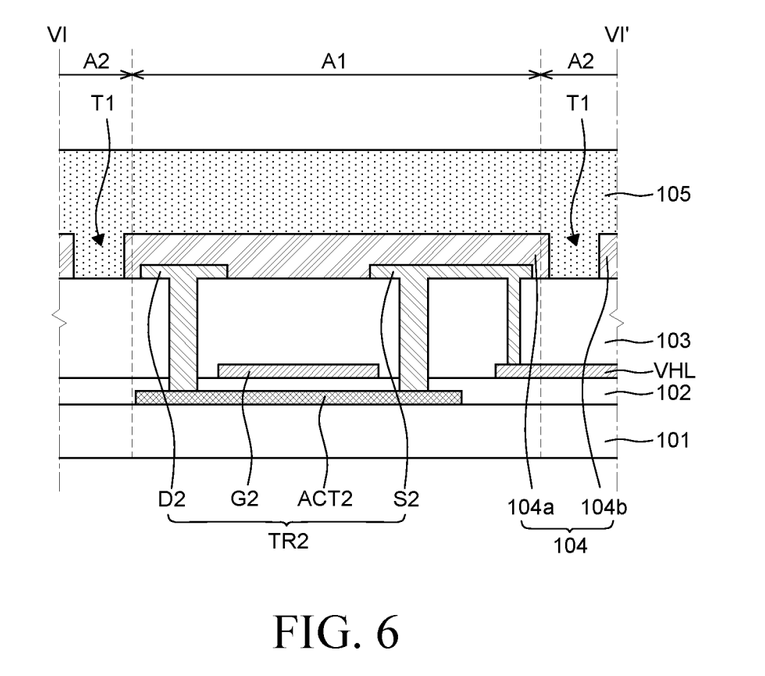
FIG. 6 is a cut-away view taken along line VI-VI' shown in FIG. 2.

FIG. 6 is a cut-away view taken along line VI-VI' shown in FIG. 2.

Referring to FIG. 2, the electrostatic discharge circuit 150 may be divided into a first area A1 disposed at a center thereof and a second area A2 surrounding the first area A1. For example, the first area A1 may have a rectangular shape, and the second area A2 may have a band shape surrounding the first area A1.

In addition, a first transistor TR1 and a second transistor TR2 may be disposed in the first area A1, and connection electrodes CE and the discharge line DL may be disposed in the second area A2.

And, referring to FIG. 3, the first transistor TR1 may be electrically connected to a low potential voltage line VLL and the discharge line DL, and the second transistor TR2 may be electrically connected to a high potential voltage line VHL and the discharge line DL.

Specifically, as shown in FIGS. 3 to 6, a first gate electrode G1 of the first transistor TR1 is connected to the discharge line DL, a first source electrode S1 of the first transistor TR1 is also connected to the discharge line DL, and a first drain electrode D1 of the second transistor TR2 is connected to the low potential voltage line VLL.

In addition, a second gate electrode G2 of the second transistor TR2 is connected to the high potential voltage line VHL, a second source electrode S2 of the second transistor TR2 is connected to the discharge line DL, and a second drain electrode D2 of the second transistor TR2 is connected to the high potential voltage line VHL.

Therefore, when high electrostatic charge is applied to the discharge line DL (indicated by a dotted line), the high electrostatic charge is input to the first source electrode S1 of the first transistor TR1, and a voltage equal to or greater than a breakdown voltage is applied between the first drain electrode D1 and the first source electrode S1 of the transistor TR1. Therefore, the first transistor TR1 breaks down, so that the high electrostatic charge applied to the first source electrode S1 of the first transistor TR1 may be discharged to the low potential voltage line VLL.

Conversely, when low electrostatic charge is applied to the discharge line DL, the low electrostatic charge is input to the second source electrode S2 of the second transistor TR2, and a voltage equal to or greater than a breakdown voltage is applied between the second drain electrode D2 and the second source electrode S2 of the second transistor TR2. Therefore, the second transistor TR2 breaks down, so that the low electrostatic charge applied to the second source electrode S2 of the second transistor TR2 may be discharged to the high potential voltage line VHL.

Hereinafter, a cross-sectional structure of the display device will be described in detail with reference to FIGS. 4 to 6.

A first active layer ACT1 of the first transistor TR1 and a second active layer ACT2 of the second transistor TR2 are disposed on a substrate 101.

The substrate 101 is a flexible substrate, and is a substrate for supporting various components of the display device. For example, the substrate 101 may be composed of polyimide (PI), polyacrylate, polyacetate, or the like.

And, if necessary, a buffer layer may be disposed on the substrate 101. The buffer layer is formed on the substrate 101 to protect various components of the display device 100 from penetration of external moisture ($H_2O$) and oxygen ($O_2$). The buffer layer may be composed of an insulating material, for example, may be configured as a single layer or multilayers of an inorganic layer composed of silicon nitride (SiNx), silicon oxide (SiOx), silicon oxynitride (SiON), or the like.

The first active layer ACT1 of the first transistor TR1 and the second active layer ACT2 of the second transistor TR2 may be disposed on the same layer to be spaced apart from each other. In addition, each of the first active layer ACT1 of the first transistor TR1 and the second active layer ACT2 of the second transistor TR2 may also be composed of an oxide semiconductor, and may be composed of amorphous silicon (a-Si), polycrystalline silicon (poly-Si), or an organic semiconductor.

A gate insulating layer 102 is disposed on the first active layer ACT1 of the first transistor TR1 and the second active layer ACT2 of the second transistor TR2. The gate insulating layer 102 is a layer for electrically insulating the first active layer ACT1 of the first transistor TR1 and the first gate electrode G1 of the first transistor TR1 and electrically insulating the second active layer ACT2 of the second transistor TR2 and the second gate electrode G2 of the second transistor TR2. In addition, the gate insulating layer 102 may be composed of an insulating material. For example, the gate insulating layer 102 may be composed of a single layer of silicon nitride (SiNx) or silicon oxide (SiOx) which is an inorganic material or multilayers of silicon nitride (SiNx) or silicon oxide (SiOx), but is limited thereto.

The first gate electrode G1 of the first transistor TR1 and the second gate electrode G2 of the second transistor TR2 are disposed on the gate insulating layer 102. The first gate electrode G1 of the first transistor TR1 and the second gate electrode G2 of the second transistor TR2 are disposed on the gate insulating layer 102 to be spaced apart from each other. In addition, the first gate electrode G1 of the first transistor TR1 overlaps the first active layer ACT1 of the first transistor TR1, and the second gate electrode G2 of the second transistor TR2 overlaps the second active layer ACT2 of the second transistor TR2.

Each of the first gate electrode G1 of the first transistor TR1 and the second gate electrode G2 of the second transistor TR2 may be composed of any one of various metal materials, for example, molybdenum (Mo), aluminum (Al), chromium (Cr), gold (Au), titanium (Ti), nickel (Ni), neodymium (Nd), and copper (Cu) or an alloy of two or more of these materials, or a multilayer thereof, but the present disclosure is not limited thereto.

In addition, a plurality of the connection electrodes CE and the high potential voltage line VHL and the low potential voltage line VLL are disposed on the gate insulating layer 102. In addition, each of the plurality of connection electrodes CE, the high potential voltage line VHL, and the low potential voltage line VLL may also be composed of the same material on the same layer as the first gate electrode G1 of the first transistor TR1 and the second gate electrode G2 of the second transistor TR2. That is, the plurality of connection electrodes CE and the high potential voltage line VHL and the low potential voltage line VLL may be composed of any one of molybdenum (Mo), aluminum (Al), chromium (Cr), gold (Au), titanium (Ti), nickel (Ni), neodymium (Nd), and copper (Cu) or an alloy of two or more of these materials, or a multilayer thereof, but the present disclosure is not limited thereto.

An interlayer insulating layer 103 is disposed on the first gate electrode G1 of the first transistor TR1, the second gate electrode G2 of the second transistor TR2, the plurality of connection electrodes CE, the high potential voltage line VHL, and the low potential voltage line. The interlayer insulating layer 103 insulates the first gate electrode G1 of the first transistor TR1, the second gate electrode G2 of the second transistor TR2, the plurality of connection electrodes CE, the high potential voltage line VHL, and the low potential voltage line VLL. The interlayer insulating layer 103 may be composed of an inorganic material. For example, the interlayer insulating layer 103 may be composed of a single layer of silicon nitride (SiNx) or silicon oxide (SiOx) which is an inorganic material or multilayers of silicon nitride (SiNx) or silicon oxide (SiOx), but the present disclosure is limited thereto.

The first source electrode S1 and the first drain electrode D1 of the first transistor TR1 are disposed on the interlayer insulating layer 103. In addition, the second source electrode S2 and the second drain electrode D2 of the second transistor TR2 are disposed on the interlayer insulating layer 103. In the first transistor TR1, the first source electrode S1 and the first drain electrode D1 may be electrically connected to the first active layer ACT1 in a manner in which they are in contact with the first active layer ACT1. In addition, in the second transistor TR2, the second source electrode S2 and the second drain electrode D2 may be electrically connected to the second active layer ACT2 in a manner in which they are in contact with the second active layer ACT2.

The first source electrode S1 and the first drain electrode D1 of the first transistor TR1 and the second source electrode S2 and the second drain electrode D2 of the second transistor TR2 may be composed of any one of various metal materials, for example, molybdenum (Mo), aluminum (Al), chromium (Cr), gold (Au), titanium (Ti), nickel (Ni), neodymium (Nd), and copper (Cu) or an alloy of two or more of these materials, or a multilayer thereof, but the present disclosure is not limited thereto.

In addition, although it has been described herein that the first transistor TR1 and the second transistor TR2 have a coplanar structure, various transistors such as a staggered structure and the like may also be used.

In addition, a plurality of the discharge lines DL are disposed on the interlayer insulating layer 103. Also, the plurality of discharge lines DL may be composed of the same material on the same layer as the source electrodes S1 and S2 and the drain electrodes D1 and D2. That is, the plurality of discharge lines DL and the source electrodes S1 and S2 and the drain electrodes D1 and D2 may be composed of any one of molybdenum (Mo), aluminum (Al), chromium (Cr), gold (Au), titanium (Ti), nickel (Ni), neodymium (Nd), and copper (Cu) or an alloy of two or more of these materials, or a multilayer thereof, but the present disclosure is not limited thereto.

A planarization layer 104 is formed on the source electrodes S1 and S2 and the drain electrodes D1 and D2 and the discharge lines DL. The planarization layer 104 planarizes upper portions of the first transistor TR1, the second transistor TR2, and the discharge lines DL. The planarization layer 104 may be composed of a single layer or a plurality of layers and may be composed of an organic material. Accordingly, the planarization layer 104 may be referred to as an organic insulating layer. For example, the planarization layer 104 may be composed of an acryl-based organic material, but is not limited thereto.

A first trench T1 is formed in the planarization layer 104 in the second area A2. The first trench T1 may have the same shape as the second area A2. That is, since the second area A2 has a band shape surrounding the first area A1, the first trench T1 may also have a band shape surrounding the first area A1. In other words, the first trench T1 may be a groove formed in the planarization layer 104 and extending in a predetermined direction along the second area A2. In addition, the first trench T1 may be formed between the first transistor TR1 and the discharge line DL and overlap the connection electrode CE. Alternatively, the first trench T1 may be formed between the second transistor TR2 and the discharge line DL and overlap the connection electrode CE. Due to the first trench T1, the planarization layer 104 may be separated in the second area A2. Accordingly, as shown in FIGS. 5 to 6, the planarization layer 104 may be separated into an inner planarization layer 104a having an island shape and an outer planarization layer 104b surrounding the inner planarization layer 104a.

A passivation layer 105 is formed on the planarization layer 104. That is, the passivation layer 105 protects the first transistor TR1 and the second transistor TR2 from penetration of moisture and oxygen. Specifically, the passivation layer 105 may be disposed not only on an upper surface of the planarization layer 104, but also inside the first trench T1 formed in the planarization layer 104. In addition, the passivation layer 105 may be composed of a single layer of silicon nitride (SiNx) or silicon oxide (SiOx) which is an inorganic material, or multilayers of silicon nitride (SiNx) or silicon oxide (SiOx), but is not limited thereto.

As described above, in the display device 100 according to an exemplary embodiment of the present disclosure, the first trench T1 may be formed in the planarization layer 104. As described above, the electrostatic discharge circuit 150 is disposed in the pad area PA adjacent to the bending area BA, and due to bending of the display panel 110 in the bending area BA, may have an effect up to the pad area PA. However, since the first trench T1 is formed in the planarization layer 104, the outer planarization layer 104b disposed outside the first trench T1 is affected by the bending in the bending area BA and thus, the outer planarization layer 104b may be spaced apart from the interlayer insulating layer 103, but the inner planarization layer 104b is not affected by the bending in the bending area BA. As a result, external moisture or oxygen does not penetrate into the plurality of transistors TR1 and TR2 disposed below the inner planarization layer 104b. Accordingly, in the display device 100 according to an exemplary embodiment of the present disclosure, even when the display panel 110 is bent, external moisture or oxygen does not penetrate into the electrostatic discharge circuit 150, so that the electrostatic discharge circuit 150 is not damaged. Thus, reliability of the electrostatic discharge circuit 150 in the display device 100 according to an exemplary embodiment of the present disclosure may be improved.

Hereinafter, a display device according to another exemplary embodiment of the present disclosure will be described in detail.

Figure 7:
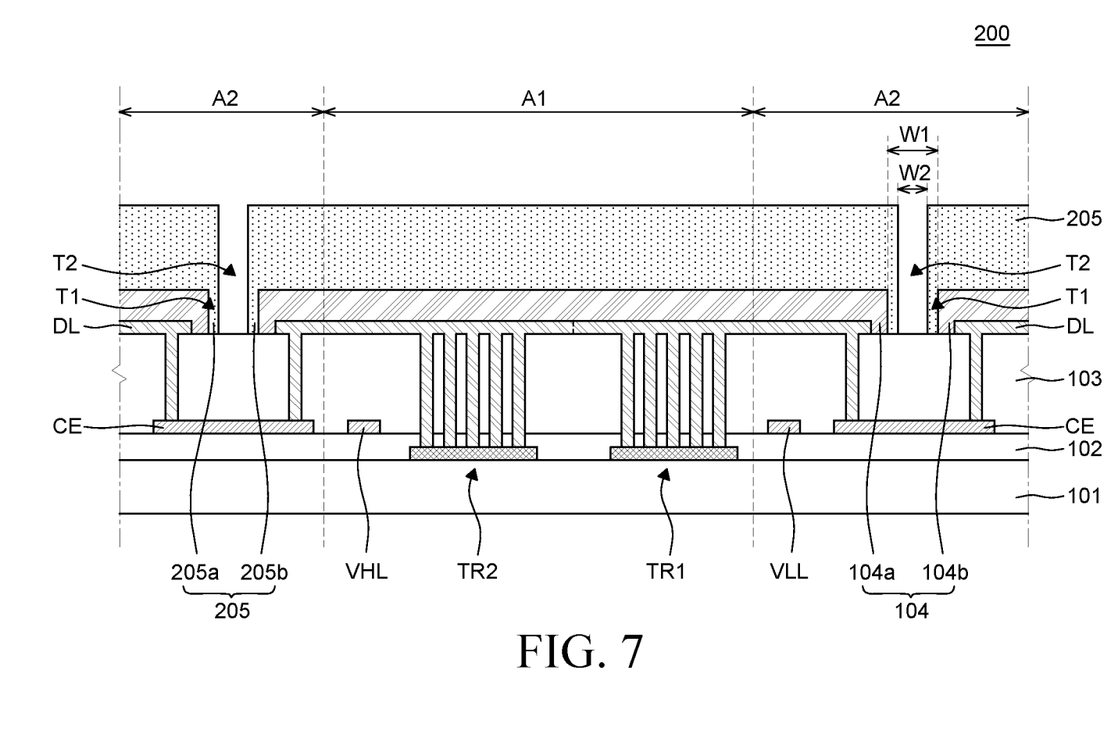
FIG. 7 is a cross-sectional view of an electrostatic discharge circuit of a display device according to another exemplary embodiment of the present disclosure.

Since a display device 200 according to another exemplary embodiment of the present disclosure is different from the display device 100 according to an exemplary embodiment of the present disclosure only in terms of a second trench T2 of a passivation layer 205, redundant contents of the display device 100 according to an exemplary embodiment of the present disclosure and the display device 200 according to another exemplary embodiment of the present disclosure will be omitted, and the second trench T2 of the passivation layer 205 will be described in detail.

FIG. 7 is a cross-sectional view of an electrostatic discharge circuit of a display device according to another exemplary embodiment of the present disclosure.

As shown in FIG. 7, the second trench T2 is formed in the passivation layer 205 in the second area A2. In addition, the second trench T2 may be formed within the first trench T1. Accordingly, the second trench T2 may also have the same shape as the second area A2. That is, since the second area A2 has a band shape surrounding the first area A1, the second trench T2 may also have a band shape surrounding the first area A1. In other words, the second trench T2 may be a groove formed in the passivation layer 205 and extending in a predetermined direction along the second area A2. In addition, the second trench T2 may be formed between the first transistor TR1 and the discharge line DL and overlap the connection electrode CE. Alternatively, the second trench T2 may be formed between the second transistor TR2 and the discharge line DL and overlap the connection electrode CE. Due to the second trench T2, the passivation layer 205 may be separated in the second area A2. Accordingly, the passivation layer 205 may be separated into an inner passivation layer 205a having an island shape and an outer passivation layer 205b surrounding the inner passivation layer 205a.

In addition, a width W2 of the second trench may be smaller than a width W1 of the first trench. Accordingly, an inner surface or side surface of the planarization layer 104 formed by the first trench T1 may be covered by the passivation layer 205. Accordingly, the inner surface or side surface of the planarization layer 104 is not exposed to the outside, and external moisture or oxygen does not penetrate into the electrostatic discharge circuit disposed below the planarization layer, so that the electrostatic discharge circuit is not damaged.

As described above, in the display device according to another exemplary embodiment of the present disclosure, the first trench T1 is formed in the planarization layer 104 and the second trench T2 is formed in the passivation layer 205, so that the inner planarization layer 104a and the inner passivation layer 205a disposed in the first trench T1 and the second trench T2 are not affected by the bending in the bending area BA. As a result, external moisture or oxygen does not penetrate into the plurality of transistors disposed below the inner planarization layer 104a and the inner passivation layer 205a. Accordingly, reliability of the electrostatic discharge circuit of the display device according to another exemplary embodiment of the present disclosure may be further improved.

The exemplary embodiments of the present disclosure can also be described as follows:

According to an exemplary embodiment of the present disclosure, a display device includes a display panel divided into a display area, a non-display area, a bending area, and a pad area and bent in one direction in the bending area; a plurality of pixels disposed in the display area; at least one gate driver disposed in the non-display area and configured to supply a gate voltage to the plurality of pixels; flexible films connected to a plurality of pads disposed in the pad area; and at least one electrostatic discharge (ESD) circuit disposed in the pad area and connected to the at least one gate driver through a discharge line.

Each of the at least one electrostatic discharge circuit may be divided into a first area and a second area surrounding the first area and may include a plurality of transistors disposed in the first area, connection electrodes disposed in the second area and configured to connect the plurality of transistors and the discharge line, a planarization layer configured to cover the plurality of transistors and composed of an organic material and a passivation layer disposed on the planarization layer and composed of an inorganic material.

A first trench may be formed in the planarization layer in the second area.

The first trench may overlap the connection electrode and surrounds the first area.

The planarization layer may be separated into an inner planarization layer and an outer planarization layer by the first trench.

The plurality of transistors may be disposed below the internal planarization layer.

A second trench may be formed in the passivation layer in the second area.

The passivation layer may be separated into an inner passivation layer and an outer passivation layer by the second trench.

The plurality of transistors may be disposed below the internal passivation layer.

The second trench may be formed within the first trench.

The plurality of transistors may include a first transistor connected to a low potential voltage line and a second transistor connected to a high potential voltage line.

The discharge line may be disposed on the same layer as a source electrode and a drain electrode of each of the plurality of transistors.

The connection electrodes may be disposed on the same layer as a gate electrode of each of the plurality of transistors.

What is claimed is:

1. A display device, comprising:
a display panel divided into a display area, a non-display area, and a pad area, the pad area being located below the display area and the non-display area;
a plurality of pixels disposed in the display area; and
at least one electrostatic discharge circuit disposed in the pad area and connected to a discharge line extending from the pad area,
wherein each of the at least one electrostatic discharge circuit is divided into a first area and a second area surrounding the first area and includes:
a plurality of transistors disposed in the first area; and
the discharge line disposed in the second area and connected to the plurality of transistors.

2. The display device of claim 1, further comprising:
at least one driver configured to supply a voltage to the plurality of pixels,
wherein the at least one electrostatic discharge circuit is connected to the at least one driver through the discharge line.

3. The display device of claim 1, further comprising:
flexible films connected to a plurality of pads disposed in the pad area.

4. The display device of claim 1, further comprising:
a display panel including a bending area and bent in one direction in the bending area, the bending area being located between the non-display area and the pad area,
wherein the discharge line overlaps the bending area.

5. The display device of claim 1, wherein the plurality of transistors include:
a first transistor connected to a low potential voltage line; and
a second transistor connected to a high potential voltage line.

6. The display device of claim 5, wherein a source electrode and a gate electrode of the first transistor are connected to the discharge line, and a drain electrode of the first transistor is connected to the low potential voltage line, and
wherein a drain electrode of the second transistor is connected to the discharge line, and a source electrode and a gate electrode of the second transistor are connected to the high potential voltage line.

7. The display device of claim 5, wherein the low potential voltage line and the high potential voltage line are disposed in the first area and overlaps the discharge line.

8. The display device of claim 1, wherein the plurality of transistors include:
a substrate;
active layers of the plurality of transistors disposed on the substrate;
a gate insulating layer disposed on the active layers;
gate electrodes of the plurality of transistors disposed on the gate insulating layer;
an interlayer insulating layer disposed on the gate electrodes; and
source electrodes and drain electrodes of the plurality of transistors disposed on the interlayer insulating layer and comprised of one of molybdenum (Mo), aluminum (Al), chromium (Cr), gold (Au), titanium (Ti), nickel (Ni), neodymium (Nd), and copper (Cu) or an alloy of two or more thereof.

9. The display device of claim 1,
wherein a planarization layer is configured to cover the plurality of transistors and comprised of an organic material.

10. The display device of claim 1,
wherein a passivation layer is configured to cover the plurality of transistors and comprised of an inorganic material.

11. The display device of claim 5,
wherein a drain electrode of the first transistor is connected to the low potential voltage line which is disposed on a different layer from the drain electrode of the first transistor and a source electrode of the second transistor is connected to the high potential voltage line which is disposed on a different layer from the source electrode of the first transistor.

12. The display device of claim 5, wherein the low potential voltage line and the high potential voltage line are comprised of any one of molybdenum (Mo), aluminum (Al), chromium (Cr), gold (Au), titanium (Ti), nickel (Ni), neodymium (Nd), and copper (Cu) or an alloy of two or more thereof.

13. A display device, comprising:
a display panel divided into a display area, a non-display area, and a pad area, the pad area being located below the display area and the non-display area;
a plurality of pixels disposed in the display area; and
at least one electrostatic discharge circuit disposed in the pad area and connected to a discharge line extending from the pad area,
wherein the electrostatic discharge circuit includes:
a first transistor connected to the discharge line;
a second transistor connected to the discharge line.

14. The display device of claim 13, wherein:
the first transistor is connected to a low potential voltage line; and
the second transistor is connected to a high potential voltage line.

15. The display device of claim 14, wherein a source electrode and a gate electrode of the first transistor are connected to the discharge line, and a drain electrode of the first transistor is connected to the low potential voltage line, and
wherein a drain electrode of the second transistor is connected to the discharge line, and a source electrode and a gate electrode of the second transistor are connected to the high potential voltage line.

16. The display device of claim 13,
wherein each of the at least one electrostatic discharge circuit is divided into a first area and a second area surrounding the first area, and includes connection electrodes disposed in the second area configured to connect the first and second transistors and the discharge line.

17. The display device of claim 16,
wherein a planarization layer is configured to cover the first and second transistors and comprised of an organic material; and
a passivation layer is disposed on the planarization layer and comprised of an inorganic material.

18. The display device of claim 17,
wherein a first trench is formed in the planarization layer in the second area.

19. The display device of claim 18,
wherein the first trench overlaps the connection electrode and surrounds the first area.

* * * * *